US012563982B2

(12) United States Patent
Entley et al.

(10) Patent No.: US 12,563,982 B2
(45) Date of Patent: Feb. 24, 2026

(54) ADDITIVES TO ENHANCE THE PROPERTIES OF DIELECTRIC FILMS

(71) Applicant: VERSUM MATERIALS US, LLC, Tempe, AZ (US)

(72) Inventors: William Robert Entley, Gilbert, AZ (US); Jennifer Lynn Anne Achtyl, Chandler, AZ (US); Raymond Nicholas Vrtis, Carlsbad, CA (US); Robert Gordon Ridgeway, Chandler, AZ (US)

(73) Assignee: Versum Materials US, LLC, Tempe, AZ (US)

( * ) Notice: Subject to any disclaimer, the term of this patent is extended or adjusted under 35 U.S.C. 154(b) by 418 days.

(21) Appl. No.: 18/044,685

(22) PCT Filed: Sep. 16, 2021

(86) PCT No.: PCT/US2021/050736

§ 371 (c)(1),
(2) Date: Mar. 9, 2023

(87) PCT Pub. No.: WO2022/066508

PCT Pub. Date: Mar. 31, 2022

(65) Prior Publication Data

US 2025/0273456 A1 Aug. 28, 2025

Related U.S. Application Data

(60) Provisional application No. 63/081,903, filed on Sep. 22, 2020.

(51) Int. Cl.
*H01L 21/02* (2006.01)

(52) U.S. Cl.
CPC .. *H01L 21/02274* (2013.01); *H01L 21/02118* (2013.01); *H01L 21/02123* (2013.01); *H01L 21/02211* (2013.01)

(58) Field of Classification Search
CPC ......... H01L 21/02274; H01L 21/02118; H01L 21/02123; H01L 21/02211
See application file for complete search history.

(56) References Cited

U.S. PATENT DOCUMENTS 6,846,515 B2 1/2005 Vrtis et al.
8,137,764 B2 3/2012 Vincent et al.
(Continued)

FOREIGN PATENT DOCUMENTS

EP 0409272 A1 1/1991

OTHER PUBLICATIONS

O'Neill, M. L. et al., "Impact of Pore Size and Morphology of porous Organosilicate Glasses on Integrated Circuit Manufacturing." Material Resources Society Symposium, vol. 914 (c) 2006 Materials Research Society.

(Continued)

*Primary Examiner* — Alexander G Ghyka
(74) *Attorney, Agent, or Firm* — Versum Materials US, LLC; David K. Benson

(57) ABSTRACT

A method for improving the elastic modulus of dense organosilica dielectric films (k≥2.7) without negatively impacting the film's electrical properties and with minimal to no reduction in the carbon content of the film. The method comprising the steps of: providing a substrate within a reaction chamber; introducing into the reaction chamber a gaseous composition comprising a mixture of an alkyl-alkoxysilacyclic compound and 5% or less of certain bis(alkoxy)silanes or mono-alkoxysilanes; and applying energy to the gaseous composition comprising the mixture of the alkyl-alkoxysilacyclic compound and 5% or less of certain bis(alkoxy)silanes or mono-alkoxysilanes to deposit an organosilicon film on the substrate, wherein the organosilicon film has a dielectric constant from ~2.70 to ~3.30, an (Continued)

elastic modulus of from ~6 to ~30 GPa, and an at. % carbon from ~10 to ~45 as measured by XPS.

24 Claims, 2 Drawing Sheets

(56) References Cited

U.S. PATENT DOCUMENTS

| | | | |
|---|---|---|---|
| 8,951,342 | B2 | 2/2015 | Vrtis et al. |
| 9,922,818 | B2 | 3/2018 | Vrtis et al. |
| 2010/0052115 | A1 | 3/2010 | Mcandrew et al. |
| 2015/0364321 | A1 | 12/2015 | Vrtis et al. |
| 2016/0049293 | A1 | 2/2016 | Li et al. |
| 2019/0244810 | A1 | 8/2019 | Vrtis et al. |
| 2019/0385840 | A1 | 12/2019 | Ridgeway et al. |

OTHER PUBLICATIONS

O'Neill, M. L. et al., "Low-k Materials by Design," Semiconductor International 2002, vol. 25, pp. 93-100.

Darnon, M. et al. "Undulation of sub-100nm Porous Dielectric Structures: A Mechanical Analysis" J. Appl. Phys. 2007, 91, 194103-1-194103-3.

Vyas, A. A. et al. "On-Chip Interconnect Conductor Materials for End-of-Roadmap Technology Nodes" IEEE Trans. Nanotechnology 2018, 17, 4-10.

Ban, Y. et al. "Electrical Impact of Line-Edge Roughness on Sub-45nm Node Standard Cell" spie09_LER.

Grill, A. et al. "Progress in the Development and Understanding of Advanced Low k and Ultralow k Dielectrics for Very Large-Scale Integrated Interconnects—State of the Art" Appl. Phys. Rev. 2014, 1, 011306.

Ryan, E. T. et al. "Property Modifications of Nanoporous pSICOH Dielectrics to Enhance Resistance to Plasma-Induced Damage" J. Appl. Phys. 2008, 104, 094109.

Lionti, K. et al. "Toward Successful Integration of Porous Low-k Materials: Strategies Addressing Plasma Damage" ECS J. Solid State Sci. and Tech. 2015, 4, N3071-N3083.

Yonekura, K. et al. "Low-Damage Damascene Patterning Using Porous Inorganic Low-Dielectric-Constant Materials" Jpn. J. Appl. Phys. 2005, 44, 2976.

Grill, A. "PECVD Low and Ultralow Dielectric Constant Materials: From Invention and Research to Products." J. Vac. Sci. Technol. B 2016, 34, 020801.

ADDITIVES TO ENHANCE THE PROPERTIES OF DIELECTRIC FILMS

CROSS-REFERENCE TO RELATED APPLICATIONS

This application for patent claims priority to U.S. Provisional Patent Application 63/081,903 filed on Sep. 22, 2020, which is hereby incorporated in its entirety.

BACKGROUND OF THE INVENTION

Described herein is a method for improving the mechanical properties of dense organosilica dielectric films (k≥2.7) without negatively impacting the film's electrical properties and with minimal to no reduction in the carbon content of the film. This is accomplished by depositing a low k film using a precursor that contains a small amount of an additive (≤5%). Post deposition treatment of the film is not required. Unexpectedly the film resulting from this deposition process shows an increase in elastic modulus without negatively impacting the film's electrical properties and with minimal to no reduction in the carbon content of the film relative to a film deposited from the same precursor in the absence of the additive.

The electronics industry utilizes dielectric materials as insulating layers between circuits and components of integrated circuits (IC) and associated electronic devices. Line dimensions are being reduced to increase the speed and memory storage capability of microelectronic devices (e.g., computer chips). As the line dimensions decrease, the insulating requirements for the interlayer dielectric (ILD) become much more rigorous. Shrinking the spacing requires a lower dielectric constant to minimize the RC time constant, where R is the resistance of the conductive line and C is the capacitance of the insulating dielectric interlayer. Capacitance (C) is inversely proportional to spacing and proportional to the dielectric constant (k) of the interlayer dielectric (ILD). Conventional silica ($SiO_2$) CVD dielectric films produced from $SiH_4$ or TEOS ($Si(OCH_2CH_3)_4$, tetraethylorthosilicate) and $O_2$ have a dielectric constant of approximately 4.0 or greater. There are several ways in which the industry has attempted to produce silica-based CVD films with lower dielectric constants, the most successful being the doping of the insulating silicon oxide film with organic groups providing dielectric constants ranging from about 2.7 to about 3.5. This organosilica glass (or low k film) is typically deposited as a dense (non-porous) film from an organosilicon precursor, such as a methylsilane or siloxane, and an oxidant, such as $O_2$ or $N_2O$. Organosilica glass will herein be referred to as OSG.

The industry has exhausted most of the suitable low k compositions for dense films with a dielectric constant below 2.7, and consequently has turned to various porous materials for applications that require a dielectric constant below 2.7. Unfortunately, decreasing the dielectric constant by integrating organic groups and/or introducing porosity into the silicon oxide network also significantly decreases the mechanical properties of the film. For example, as taught in U.S. Pat. Nos. 8,137,764 and 9,922,818 the mechanical properties of a dense low k film decrease much faster than the dielectric constant as the percentage of organic groups in the low k silicon oxide based network is increased. Similarly, the mechanical properties of a porous low k film decrease much faster than the dielectric constant as the percentage of porosity in the low k silicon oxide based network is increased (see O'Neill, M. L. et al. MRS Proceedings Symposium 2006, 914, F01-02; O'Neill, M. L. et al. Semiconductor International 2002, 25, 93-100). However, for the most advanced technology nodes in the lowest levels of the back end of line (BEOL) low k materials with the highest possible mechanical properties are required. Due to the shrinking device dimensions and the smaller pitches in advanced technology nodes the low k materials used in the lowest levels of the BEOL must also have the greatest resistance to plasma or process induced damage (PID), the lowest possible leakage current, and the highest possible initial breakdown field. As the mechanical properties and resistance to PID of dense low k films are typically greater than that of porous low k films, dense low k films are typically used in the lowest levels of the BEOL. In addition to benefiting chip packaging and CMP, increased mechanical properties in low k films reduce line edge roughness in patterned features, reduce pattern collapse, and provide greater internal mechanical stress within an interconnect, reducing failures due to electromigration (see Darnon, M. et al. "Undulation of sub-100 nm Porous Dielectric Structures: A Mechanical Analysis" *J. Appl. Phys.* 2007, 91, 194103-1-194103-3; Vyas, A. A. et al. "On-Chip Interconnect Conductor Materials for End-of-Roadmap Technology Nodes" *IEEE Trans. Nanotechnology* 2018, 17, 4-10; Ban, Y. et al. "Electrical Impact of Line-Edge Roughness on Sub-45 nm Node Standard Cell" *spie09_LER*; Grill, A. et. al. "Progress in the Development and Understanding of Advanced Low k and Ultralow k Dielectrics for Very Large-Scale Integrated Interconnects—State of the Art" *Appl. Phys. Rev.* 2014, 1, 011306). The need for increased mechanical properties becomes more important as the pitch decreases in advanced technology nodes, particularly for the lowest layers in the back end of the line. This need has driven the search for new dense low k films with relatively high dielectric constants (3.0≤k≤3.5) and the highest possible mechanical properties.

Plasma or process induced damage in low k films is caused by the removal of carbon during plasma exposure, particularly during etch and photoresist strip processes (e.g., $NH_3$ based strip processes) (see Ryan, E. T. et al. "Property Modifications of Nanoporous pSiCOH Dielectrics to Enhance Resistance to Plasma-Induced Damage" *J. Appl. Phys.* 2008, 104, 094109; Lionti, K. et al. "Toward Successful Integration of Porous Low-k Materials: Strategies Addressing Plasma Damage" *ECS J. Solid State Sci. And Tech.* 2015, 4, N3071-N3083; Yonekura, K. et al. "Low-Damage Damascene Patterning Using Porous Inorganic Low-Dielectric-Constant Materials" *Jpn. J. Appl. Phys.* 2005, 44, 2976). Carbon depletion causes the plasma damaged region to change from hydrophobic to hydrophilic. Exposure of the hydrophilic plasma damaged region to dilute HF-based (0.1 to 0.5 wt %) wet chemical post plasma treatments results in rapid dissolution of the damaged region and an increase in the k of the film (the hydrophobic damaged layer increases moisture uptake). In patterned low k films (created using etch and photoresist strip processes) plasma/process induced damage results in profile erosion when the plasma damaged sidewalls of the patterned feature are exposure to dilute HF-based post plasma treatments. Profile erosion can result in the formation of re-entrant features (resulting in metallization defects) and reduced spacing between metal lines (resulting in increased capacitance) (see Grill, A. "PECVD Low and Ultralow Dielectric Constant Materials: From Invention and Research to Products." *J. Vac. Sci. Technol. B* 2016, 34, 020801). This is particularly problematic in advanced logic devices, where the depth of profile erosion can be a significant fraction of the logic ½ pitch. In general, the greater the carbon content of the low k film the lower the depth of PID. Process induced damage and the resulting profile erosion in low k films is a significant problem that device manufacturers must overcome when integrating low k materials in a ULSI interconnect, particularly for the lowest levels in the back end of the line.

Multiple methods have been reported to increase the mechanical properties of low k films. These include, but are not limited to, thermal treatment (U.S. Pat. No. 6,846,515), broadband ultraviolet (UV) curing (U.S. Pat. No. 8,951, 342), the use of low k precursors that inherently result in the deposition of low k films with superior mechanical properties (U.S. Pat. No. 6,846,515), and the use of hardening additives (U.S. Pat. No. 8,137,764).

Both thermal treatment and broadband UV curing can improve the mechanical properties of as deposited low k films. However, both thermal treatment and UV curing decrease the carbon content of the film, resulting in greater PID, which is also not desirable. Both thermal treatment and UV curing also require post-processing of the as deposited film, which adds processing time (decreasing throughput), cost (such as additional hardware, for example, a UV cure chamber), and complexity. This is not desirable, especially for the lowest levels in the BEOL where advanced IC manufacturers are seeking low k films that have both the greatest resistance to PID and the highest possible mechanical properties in the absence of post treatment.

One of the simplest methods to improve the mechanical properties of a low k film is to use a precursor that inherently results in the deposition of a low k film with superior mechanical properties. For example, in U.S. Pat. No. 6,846, 515 the precursor diethoxymethylsilane, sold under the trademark DEMS, (hereinafter DEMS®) was shown to deposit low k films, with a k of 3.5 or less, that have unexpectedly superior mechanical properties as indicated by Young's modulus and nanoindentation hardness, compared to the alterative precursors trimethylsilane (TMS) and dimethyldimethoxysilane (DMDMOS). This was attributed to the DEMS® based films having a higher oxygen content and a lower carbon content relative to the other films at the same value of the dielectric constant. The increased oxygen content likely results in better three-dimensional network connectivity, and thus the improved mechanical properties.

The use of a single low k precursor that inherently results in the deposition of low k films with superior mechanical properties without additional post deposition steps (i.e., as deposited films) also results in a simplified process scheme with the lowest cost of ownership as the throughput is maximized (post deposition steps are not required) and additional hardware (i.e., a UV cure chamber) is not required. However, low k films deposited from precursors that result in the highest mechanical properties necessarily have a low total carbon content and thus limited resistance to PID. While UV curing can further increase the mechanical properties of these films, this further reduces the films' carbon content and thus further reduces the resistance to PID in these films. Consequently, even the most promising low k precursors that inherently result in the deposition of low k films with superior mechanical properties may not meet the requirements for the most advanced technology nodes in the lowest levels of the BEOL where both the highest possible mechanical properties and the greatest resistance to PID are required.

For dense low k films it is recognized that as the number of silicon-alkoxy groups (e.g., Si—$OCH_3$, Si—$OCH_2CH_3$, etc.) in a low k precursor increase and the number of silicon-carbon bonds (e.g., Si—$CH_3$, Si—$CH_2CH_3$, etc.) in the precursor decrease, the dielectric constant and mechanical properties of the as deposited film will increase and the carbon content of the film will decrease. Thus, films deposited from precursors containing four silicon-alkoxy groups and containing no silicon-carbon bonds per silicon atom in the precursor (e.g., TEOS) have a higher dielectric constant, greater mechanical properties, and less carbon than films deposited from precursors containing three silicon-alkoxy groups per silicon and up to one silicon-carbon bond per silicon (e.g., triethoxysilane or TES and methyl-triethoxysilane or MTES), which in turn have a higher dielectric constant, higher mechanical properties, and less carbon than films deposited from precursors containing two silicon-alkoxy groups and one or two silicon-carbon bonds per silicon (e.g., DEMS® and DMDMOS), which in turn have a higher dielectric constant, higher mechanical properties, and less carbon than films deposited from precursors containing only a single silicon-alkoxy group and up to three silicon-carbon bonds per silicon (e.g., diethyl-isopropoxymethylsilane and trimethylsilane).

This concept was used in U.S. Pat. No. 8,137,764 to enhance the mechanical properties of dense low k films by depositing films using a mixture of two different precursors during the deposition process. One precursor (the hardening additive), selected to increase the mechanical properties of the film, contained 3 to 4 silicon oxygen bonds per silicon atom and no silicon-carbon bonds, such as TEOS or triethoxysilane (TES). The second precursor, the low k precursor, contained one or more silicon-carbon bonds, such as DEMS® or DMDMOS. As the percentage of the hardening additive (the compound with the greater number of silicon-alkoxy groups) was increased the mechanical properties of the film increased. A representative example from U.S. Pat. No. 8,137,764 is the deposition of a low k film from a blend of TES (50%) and DEMS® (50%). The resulting k=3.17 film deposited from the blend of TES and DEMS® had a higher hardness (1.76 GPa) than a film at a similar value of the dielectric constant (k=3.16) deposited only from DEMS® (1.58 GPa). The 10% increase in the hardness of the low k film deposited from the blend of TES and DEMS® was attributed to the higher oxygen content, and presumably lower carbon content, of this film relative to the film deposited only from DEMS®. The increased oxygen content, and decreased carbon content, likely resulted in better three-dimensional network connectivity, and thus improved mechanical properties.

The concept of enhancing the mechanical properties of dense low k films by depositing the film using a mixture of two different precursors during the deposition process as described in U.S. Pat. No. 8,137,764 has several limitations. First is that the hardening additive contains no silicon-carbon bonds and is thus dilutive to the incorporation of silicon-carbon bonds into the network structure. As the invention in U.S. Pat. No. 8,137,764 requires a high percentage of the hardening additive to achieve a measurable increase in the mechanical properties of the film, example mixtures typically being comprised of 25% to 50% of the hardening additive, the impact on the resulting films carbon content can be significant. Thus, while low k films deposited using a combination of a low k precursor containing a silicon carbon bond and a hardening additive that does not contain a silicon-carbon bond can have improved mechanical properties, this strategy can also increase the dielectric constant and decrease the carbon content of the film, the decrease in carbon content of the film resulting in greater plasma or process induced damage (PID).

Another limitation of this invention is that the deposition conditions that result in the highest mechanical strength for the precursor containing a silicon-carbon bond are typically different from the deposition conditions that result in the highest mechanical strength for the hardening additive that does not contain a silicon-carbon bond. For example, the highest mechanical strength for a precursor containing a silicon-carbon may require low $O_2$ flow rates during the deposition process, while the highest mechanical strength for a hardening additive that does not contain a silicon-carbon bond may require high $O_2$ flow rates during the deposition process. Finding optimum deposition conditions for a mixture of a precursor that contains a silicon-carbon bond and a hardening additive that does not contain a silicon-carbon bond such that the resulting film has enhanced mechanical properties at the desired value of the dielectric constant without impacting the intrinsic film properties, such as a films leakage current and initial breakdown field, is challenging. For example, recent work has shown that films deposited using a combination of a low k precursor containing a silicon carbon bond (e.g., DEMS®) and a hardening additive that does not contain a silicon-carbon bond (e.g., TEOS) have a higher leakage current and a lower initial breakdown voltage relative to films deposited from the low k precursor containing a silicon carbon bond (e.g., DEMS®).

U.S. Pat. Appl. No. 2019/0244810 discloses that the elastic modulus of a low k film deposited from an organosilane such as DEMS® can be increased by depositing the film using a mixture of DEMS® and a second silicon containing precursor, such as iso-butyltriethoxysilane (iBTEOS). In this case iBTEOS functions as a hardening additive, resulting in film with an elastic modulus greater than a film at the same dielectric constant deposited using only the DEMS® precursor. The hardening additives in U.S. Pat. Appl. No. 2019/0244810 contain silicon-carbon bonds and thus differ from the hardening additives described in U.S. Pat. No. 8,137,764. Specifically, the hardening additives in U.S. Pat. Appl. No. 2019/0244810 are described by the formula $$R^1{}_nSi(OR^2)_{4-n}$$

wherein $R^1$ is a linear, branched, or cyclic $C_2$-$C_6$ alkyl group; n=1-3; and $R^2$ is a linear, branched, or cyclic $C_1$-$C_6$ alkyl group.

A limitation of U.S. Pat. Appl. No. 2019/0244810 is that the deposition mixture requires a high percentage of the hardening additive to achieve a measurable increase in the mechanical properties of the film. For example, the binary deposition mixtures of DEMS® and iBTEOS described in U.S. Pat. Appl. No. 2019/0244810 are comprised of 66% to 80% of iBTEOS and increased the mechanical properties of the film by up to 19% at the same value of the dielectric constant. The high percentage of the triethoxysilane derivative (iBTEOS) required is also dilutive to the carbon content of the film, resulting in low k films with a low total carbon content (<10.1 atomic % by XPS) and presumably a poor resistance to plasma induced damage.

Another limitation of U.S. Pat. Appl. No. 2019/0244810 is that the deposition conditions that result in the highest mechanical properties for the DEMS® based film are typically different the deposition conditions that result in the highest mechanical properties for the hardening additive (iBTEOS). For example, the highest mechanical properties for DEMS® based depositions may require low $O_2$ flow rates during the deposition process, while the highest mechanical properties for iBTEOS may require high $O_2$ flow rates during the deposition process. Finding optimum deposition conditions for the mixture of precursors that result in enhanced mechanical properties at the desired value of the dielectric constant without impacting the intrinsic film properties, such as a films leakage current and initial breakdown field, is challenging.

Another limitation of U.S. Pat. Appl. No. 2019/0244810 is that the very high elastic moduli disclosed for the exemplary binary deposition mixtures of DEMS® and iBTEOS were achieved after UV curing post deposition treatment of the as deposited films. This is not desirable as UV curing decreases the carbon content and increases the porosity of the film, resulting in greater process induced damage. In addition, post deposition steps such as UV curing increase the cost of ownership as the throughput is decreased (post deposition steps are required) and additional hardware (i.e., a UV cure chamber) is required.

Thus, particularly for lowest levels in the back end of the line, there is a need for low k films that have the highest possible mechanical properties, a high carbon content to provide a strong resistance to PID, a low leakage current, and a high initial breakdown voltage at a given value of the dielectric constant (k<3.5). The deposited films should not require post deposition steps to improve their mechanical properties. That is, post deposition steps, such as UV curing, are not needed.

BRIEF SUMMARY OF THE INVENTION

The method and composition described herein fulfill one or more needs described above.

As taught in U.S. Pat. No. 9,922,818 alkyl-alkoxysilacyclic compounds can be used to deposit low k films that have both high mechanical strength and a high total carbon content relative to prior art structure former precursors such as DEMS®. However, it is desirable to further increase the mechanical properties of alkyl-alkoxysilacyclic based films without decreasing the films carbon content, decreasing the films resistance to PID, or impacting the intrinsic film properties, such as a films leakage current and initial breakdown field, to meet low k film requirements for the lowest levels in the BEOL. It is also desirable to do this without a post-deposition treatment such as a UV cure.

It was discovered that low k films deposited using a combination of an alkyl-alkoxysilacyclic precursor and a small amount (≤5%) of certain bis-alkoxysilanes or mono-alkoxysilanes increase the elastic modulus of the film with minimal to no impact on other film properties. That is, low k films deposited using a combination of an alkyl-alkoxysilacyclic precursor and a small amount (≤5%) of certain bis-alkoxysilanes or mono-alkoxysilanes: 1) increase the elastic modulus of the film, 2) result in minimal to no change on the dielectric constant of the film, 3) result in minimal to no change on the XPS carbon content of the film, 4) is expected to result in minimal to no change in the films resistance to PID, and 5) is expected to result in minimal to no change on the leakage current or initial breakdown field of the film relative to the equivalent film deposited in the absence of the bis-alkoxysilane. The increase in elastic modulus occurs for the as deposited film, that is without a post-deposition treatment such as a UV cure.

A combination of an alkyl-alkoxysilacyclic precursor and a small amount (≤5%) of certain bis-alkoxysilanes or mono-alkoxysilanes can be used to deposit dense low k films with k values from about 2.70 to about 3.50, such films exhibiting an increase in elastic modulus, minimal to no change in the XPS carbon content of the film, and is expected to result in minimal to no change in the films resistance to PID, and is expected to result in minimal to no change in the leakage current or initial breakdown field of the film relative to an equivalent film deposited in the absence of the bis-alkoxysilane. The increase in elastic modulus occurs without the need for post deposition treatment steps, such as UV curing.

In one aspect, this disclosure provides a method for making a dense organosilica film with an increase in elastic modulus, the method comprising the steps of: providing a substrate within a reaction chamber; introducing into the reaction chamber a gaseous composition comprising an alkyl-alkoxysilacyclic compound having the structure given in Formula (1):

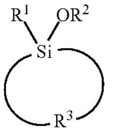

(I)

wherein $R^1$ is independently selected from hydrogen, a linear or branched $C_1$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ hetero-cyclic alkyl group, a $C_5$ to $C_{10}$ aryl group, and a $C_3$ to $C_{10}$ hetero-aryl group; $R^2$ is selected from hydrogen, a linear or branched $C_1$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ hetero-cyclic alkyl group, a $C_5$ to $C_{10}$ aryl group, and a $C_3$ to $C_{10}$ hetero-aryl group; and $R^3$ is selected from a $C_3$ to $C_{10}$ alkyl di-radical which forms a four-membered, five-membered, or six-membered cyclic ring with the Si atom and 5% or less of a bis-alkoxysilane compound having the structure given in Formula (2) or a mono-alkoxysilane compound having the structure given in Formula (3):

$$R^6R^5Si(OR^4)_2 \quad (2)$$

$$HR^6R^5Si(OR^4) \quad (3)$$

wherein $R^4$ is selected from hydrogen, a linear or branched $C_1$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ hetero-cyclic alkyl group, a $C_5$ to $C_{10}$ aryl group, and a $C_3$ to $C_{10}$ hetero-aryl group and $R^5$ and $R^6$ are independently selected from hydrogen, a linear or branched $C_1$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ hetero-cyclic alkyl group, a $C_5$ to $C_{10}$ aryl group, and a $C_3$ to $C_{10}$ hetero-aryl group; introducing into the reaction chamber a gaseous mixture comprising an alkyl-alkoxysilacyclic compound of Formula (1) and a bis-alkoxysilane compound having the structure given in Formula (2) or a mono-alkoxysilane compound having the structure given in Formula (3); and applying energy to the gaseous mixture comprising the alkyl-alkoxysilacyclic compound of Formula (1) and a bis-alkoxysilane compound having the structure given in Formula (2) or a mono-alkoxysilane compound having the structure given in Formula (3) in the reaction chamber to induce reaction of the gaseous mixture comprising the alkyl-alkoxysilacyclic compound of Formula (1) and a bis-alkoxysilane compound having the structure given in Formula (2) or a mono-alkoxysilane compound having the structure given in Formula (3) to deposit an organosilica film on the substrate, wherein the organosilica film has a dielectric constant from ~2.70 to ~3.3, an elastic modulus from ~6 to ~28 GPa, and an atomic (at.) % carbon from ~10 to ~45 as measured by XPS.

For Formula (2) and Formula (3) combinations of $R^4$, $R^5$, and $R^6$ groups are selected such that the molecule's boiling point is less than 200° C., preferably less than 150° C. In addition, for optimum performance some of the R groups may be selected such that they form secondary or tertiary radicals upon homolytic bond dissociation (e.g., SiO—R→SiO·+R·, where R· is a secondary or tertiary radical such as an isopropyl radical, a sec-butyl radical, or a tert-butyl radical).

DETAILED DESCRIPTION OF THE INVENTION

Figure 1:
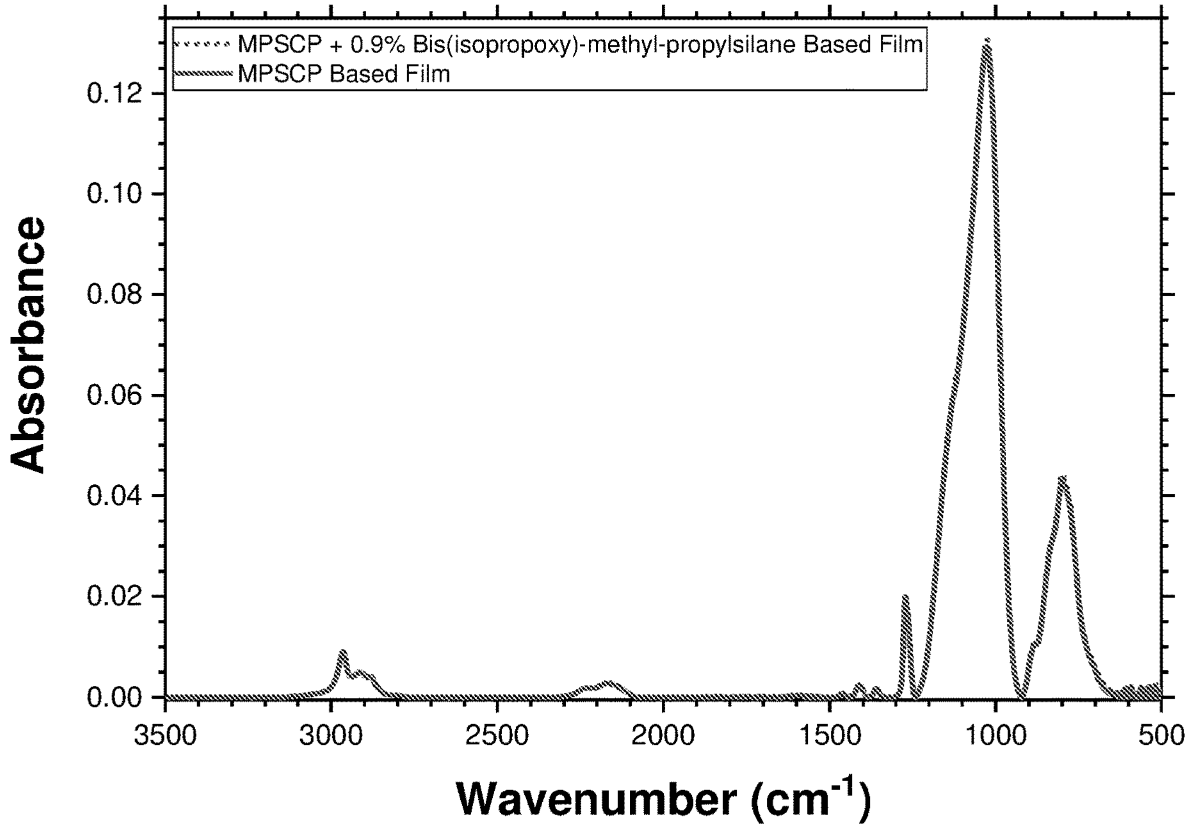
FIG. 1 shows the infrared spectrum of a comparative film deposited from 1-methyl-1-ethoxy-1-silacyclopentane (MPSCP) and a spectrum of a film deposited from a mixture of MPSCP and 0.9% bis(isopropoxy)-methyl-butylsilane.

Described herein is a chemical vapor deposition method for making a dense organosilica film with improved mechanical properties, the method comprising the steps of: providing a substrate within a reaction chamber; introducing into the reaction chamber a gaseous mixture comprising an alkyl-alkoxysilacyclic compound of Formula (1) and 5% or less of a bis-alkoxysilane compound having the structure given in Formula (2) or a mono-alkoxysilane compound having the structure given in Formula (3), a gaseous oxidant such as $O_2$ or $N_2O$, and an inert gas such as He; and applying energy to the gaseous mixture comprising an alkyl-alkoxysilacyclic compound of Formula (1) and a bis-alkoxysilane compound having the structure given in Formula (2) or a mono-alkoxysilane compound having the structure given in Formula (3) in the reaction chamber to induce reaction of the gaseous mixture comprising an alkyl-alkoxysilacyclic compound of Formula (1) and a bis-alkoxysilane compound having the structure given in Formula (2) or a mono-alkoxysilane compound having the structure given in Formula (3) to deposit an organosilica film on the substrate, wherein the organosilica film has a dielectric constant of from ~2.70 to ~3.30, an elastic modulus from ~6 to ~30 GPa, and an atomic % carbon from ~10 to ~45 as measured by XPS, preferably a dielectric constant of from ~2.80 to ~3.20, an elastic modulus of from ~7 to ~27 GPa, and an atomic % carbon from ~10 to ~40 as measured by XPS. It is recognized that OSG films with the desired film properties can also be deposited using a gaseous composition that does not include an oxidant.

The gaseous mixture comprising an alkyl-alkoxysilacyclic compound of Formula (1), such as 1-methyl-1-ethoxy-1-silacyclopentane (MPSCP), and 5% or less a bis-alkoxysilane compound having the structure given in Formula (2), such as bis(isopropoxy)-methyl-butylsilane, or a mono-alkoxysilane compound having the structure given in Formula (3), such as dimethyl-isopropoxysilane, provides unique attributes that make it possible to achieve a relatively low dielectric constant for a dense organosilica film with a higher elastic modulus compared to films deposited from an alkyl-alkoxysilacyclic compound in the absence of a bis-alkoxysilane compound having the structure given in Formula (2) or a mono-alkoxysilane compound having the structure given in Formula (3). While the addition of 5% or less of a bis-alkoxysilane compound having the structure given in Formula (2) or a mono-alkoxysilane compound having the structure given in Formula (3) to an alkyl-alkoxysilacyclic compound of Formula (1) increases the elastic modulus of the as deposited film, it has minimal to no change on the dielectric constant of the film, minimal to no change on the XPS carbon content of the film, is expected to result in minimal to no change in the films resistance to PID, and is expected to result in minimal to no change in the leakage current or initial breakdown field of the film relative to the equivalent film deposited in the absence of a bis-alkoxysilane compound having the structure given in Formula (2) or a mono-alkoxysilane compound having the structure given in Formula (3). The increase in the elastic modulus occurs for the as deposited film, that is without a post-deposition treatment such as a UV cure.

It is unexpected that the addition of 5% or less of a bis-alkoxysilane compound having the structure given in Formula (2) or a mono-alkoxysilane compound having the structure given in Formula (3) to an alkyl-alkoxysilacyclic based deposition of Formula (1) would result in an increase in the elastic modulus without resulting in an increase in the dielectric constant, a lower XPS carbon content, an expected decrease in resistance to PID, an expected increase in leakage current, and an expected decrease in the initial breakdown field. To illustrate, the examples in U.S. Pat. No. 8,137,764 show that to achieve a measurable increase in the film's mechanical properties relative to a DEMS® only based deposition a high percentage of hardening additive is required, between 25% to 75%. Further, as the percentage of hardening additive is increased the mechanical properties of the resulting film increase. As the hardening additive in U.S. Pat. No. 8,137,764 contains 3 to 4 silicon oxygen bonds per silicon atom and no silicon-carbon bonds (such as TEOS or triethoxysilane (TES)), it is dilutive to the carbon content of the low k film, resulting in a lower XPS carbon content and less resistance to PID. Thus, as the percentage of hardening additive is increased the mechanical properties of the film increase, the carbon content of the film decreases, and the oxygen content of the film increases. Similarly, the examples in U.S. Pat. Appl. No. 2019/0244810 show that to achieve a measurable increase in the film's mechanical properties relative to a DEMS® based deposition a high percentage of hardening additive (isobutyl-triethoxysilane, iBTEOS) is required; between 66% to 80%. The triethoxysilane based hardening additive iBTEOS in U.S. Pat. Appl. No. 2019/0244810 has one silicon-carbon bond and three silicon-alkoxy groups per silicon and is thus dilutive to the carbon content of the film relative to contributions from the DEMS® precursor, which has only two silicon-alkoxy groups per silicon. This is reflected in the low XPS carbon content (<11%) of all example films in U.S. Pat. Appl. No. 2019/0244810. The increased mechanical properties of the example films in U.S. Pat. No. 8,137,764 and U.S. Pat. Appl. No. 2019/0244810 is thus attributed to a higher oxygen content and a lower carbon content relative to DEMS® based films deposited in the absence of a hardening additive at the same value of the dielectric constant. The increased oxygen content likely results in better three-dimensional network connectivity, and thus the improved mechanical properties. However, the lower carbon content in the example films in U.S. Pat. No. 8,137,764 and U.S. Pat. Appl. No. 2019/0244810 is expected to result in a decreased resistance to PID. It is thus unexpected that the addition of 5% or less of a bis-alkoxysilane compound having the structure given in Formula (2) or a mono-alkoxysilane compound having the structure given in Formula (3) to a mono-alkoxy alkyl-alkoxysilacyclic based deposition would result in an increase in the elastic modulus of the film with minimal to no increase in the dielectric constant, minimal to no increase in the XPS carbon content, minimal to no decrease in the resistance to PID, minimal to no increase in the leakage current, and minimal to no decrease in the initial breakdown field.

Dense low k films deposited in accordance with U.S. Pat. No. 8,137,764 exhibit a higher leakage current and a lower initial breakdown field relative to films deposited in the absence of a hardening additive. That is films deposited using a mixture of a hardening additive containing no silicon carbon bonds (e.g., TEOS) and a low k precursor containing one or more silicon-carbon bonds (e.g., DEMS®) have a higher leakage current and a lower initial breakdown field relative to DEMS® based films deposited without a hardening additive. This is clearly not desirable as IC manufacturers are continually driving to decrease the leakage current and increase the initial breakdown field as device geometries continue to shrink, particularly for the lowest levels in the BEOL. In contrast, dense low k films deposited from a gaseous mixture comprising an alkyl-alkoxysilacyclic compound of Formula (1) such as MPSCP and 5% or less of a bis-alkoxysilane compound having the structure given in Formula (2), such as bis(isopropoxy)-methyl-butylsilane, or a mono-alkoxysilane compound having the structure given in Formula (3), such as dimethyl-isopropoxysilane, in accordance with this invention are expected to show minimal to no change in the leakage current and initial breakdown field relative to a film deposited from an alkyl-alkoxysilacyclic compound of Formula (1) in the absence of a bis-alkoxysilane compound having the structure given in Formula (2) or a mono-alkoxysilane compound having the structure given in Formula (3).

Some of advantages over the prior art alkyl-alkoxysilacyclic based films achieved with this invention include, but are not limited to: an increase the elastic modulus of the film with minimal to no change in the dielectric constant of the film, minimal to no change in the XPS carbon content of the film, expected minimal to no reduction in the films resistance to PID, and expected minimal to no increase in the leakage current, and expected minimal to no decrease in the initial breakdown field of the film relative to an equivalent film deposited in the absence of a bis-alkoxysilane compound having the structure given in Formula (2) or a mono-alkoxysilane compound having the structure given in Formula (3).

The alkyl-alkoxysilacyclic compounds of Formula (1), the bis-alkoxysilane compounds of Formula (2), and the mono-alkoxysilane compound of Formula (3) are preferably substantially free of halide ions. As used herein, the term "substantially free" as it relates to halide ions (or halides) such as, for example, chlorides (i.e. chloride-containing species such as HCl or silicon compounds having at least one Si—Cl bond) and fluorides, bromides, and iodides, means less than 5 ppm (by weight) measured by ion chromatography (IC), preferably less than 3 ppm measured by IC, and more preferably less than 1 ppm measured by IC, and most preferably 0 ppm measured by IC. Significant levels of chloride in the final product can cause the silicon precursor compounds to degrade. The gradual degradation of the silicon precursor compounds may directly impact the film deposition process making it difficult for the semiconductor manufacturer to meet film specifications. In addition, the shelf-life or stability is negatively impacted by the higher degradation rate of the silicon precursor compounds thereby making it difficult to guarantee a 1-2 year shelf-life. Therefore, the accelerated decomposition of the silicon precursor compounds presents safety and performance concerns related to the formation of these flammable and/or pyrophoric gaseous byproducts. The alkyl-alkoxysilacyclic compounds of Formula (1), the bis-alkoxysilane compounds of Formula (2), and the mono-alkoxysilane compound of Formula (3) are preferably substantially free of metal ions such as, $Li^+$, $Na^+$, $K^+$, $Mg^{2+}$, $Ca^{2+}$, $Al^{3+}$, $Fe^{2+}$, $Fe^{3+}$, $Ni^{2+}$, $Cr^{3+}$. As used herein, the term "substantially free" as it relates to Li, Na, K, Mg, Ca, Al, Fe, Ni, Cr means less than 5 ppm (by weight), preferably less than 3 ppm, and more preferably less than 1 ppm, and most preferably 0.1 ppm as measured by ICP-MS. In some embodiments, the alkyl-alkoxysilacyclic compounds of Formula (1), the bis-alkoxysilane compounds of Formula (2), and the mono-alkoxysilane compound of Formula (3) are free of metal ions such as, $Li^+$, $Na^+$, $K^+$, $Mg^{2+}$, $Ca^{2+}$, $Al^{3+}$, $Fe^{2+}$, $Fe^{3+}$, $Ni^{2+}$, $Cr^{3+}$. As used herein, the term "free of" metal impurities as it relates to Li, Na, K, Mg, Ca, Al, Fe, Ni, Cr, means less than 1 ppm, preferably 0.1 ppm (by weight) as measured by ICP-MS, most preferably 0.05 ppm (by weight) as measured by ICP-MS or other analytical method for measuring metals.

The low k dielectric films are organosilica glass ("OSG") films or materials. Organosilicates are employed in the electronics industry, for example, as low k materials. Material properties depend upon the chemical composition and structure of the film. Since the composition of the gaseous mixture of organosilicon precursors has a strong effect upon the films structure and composition, it is beneficial to use a mixture of organosilicon precursors that provide the required film properties to ensure that the addition of the needed amount of porosity to reach the desired dielectric constant does not produce films that are mechanically unsound. The method and composition described herein provide the means to generate low k dielectric films that have a desirable balance of electrical and mechanical properties as well as other beneficial film properties as high carbon content to provide improved integration plasma resistance.

In certain embodiments of the method and composition described herein, a layer of silicon-containing dielectric material is deposited on at least a portion of a substrate via a chemical vapor deposition (CVD) process employing a reaction chamber. The method thus includes the step of providing a substrate within a reaction chamber. Suitable substrates include, but are not limited to, semiconductor materials such as gallium arsenide ("GaAs"), silicon, and compositions containing silicon such as crystalline silicon, polysilicon, amorphous silicon, epitaxial silicon, silicon dioxide ("$SiO_2$"), silicon glass, silicon nitride, fused silica, glass, quartz, borosilicate glass, and combinations thereof. Other suitable materials include chromium, molybdenum, and other metals commonly employed in semi-conductor, integrated circuits, flat panel display, and flexible display applications. The substrate may have additional layers such as, for example, silicon, $SiO_2$, organosilicate glass (OSG), fluorinated silicate glass (FSG), boron carbonitride, silicon carbide, hydrogenated silicon carbide, silicon nitride, hydrogenated silicon nitride, silicon carbonitride, hydrogenated silicon carbonitride, boronitride, organic-inorganic composite materials, photoresists, organic polymers, porous organic and inorganic materials and composites, metal oxides such as aluminum oxide, and germanium oxide. Still further layers can also be germanosilicates, aluminosilicates, copper and aluminum, and diffusion barrier materials such as, but not limited to, TiN, Ti(C)N, TaN, Ta(C)N, Ta, W, or WN.

The reaction chamber is typically, for example, a thermal CVD or a plasma enhanced CVD reactor or a batch furnace type reactor in a variety of ways. In one embodiment, a liquid delivery system may be utilized. In liquid delivery formulations, the precursor mixture comprised of an alkyl-alkoxysilacyclic compound of Formula (1) and 5% or less of a bis-alkoxysilane Formula (2) or a mono-alkoxysilane compound of Formula (3) may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

The method disclosed herein includes the step of introducing into the reaction chamber a gaseous composition comprising an alkyl-alkoxysilacyclic compound of Formula (1) and 5% or less of a bis-alkoxysilane of Formula (2) or a mono-alkoxysilane compound of Formula (3). In some embodiments, the composition may include additional reactants such as, for example, oxygen-containing species such as, for example, $O_2$, $O_3$, and $N_2O$, gaseous or liquid organic substances, alcohols, $CO_2$, or CO. In one embodiment, the reaction mixture introduced into the reaction chamber comprises at least one oxidant selected from the group consisting of $O_2$, $N_2O$, NO, $NO_2$, $CO_2$, water, $H_2O_2$, ozone, and combinations thereof. In an alternative embodiment, the reaction mixture does not comprise an oxidant.

The composition for depositing the dielectric film described herein comprises from about 95 to about 99.9 weight percent of an alkyl-alkoxysilacyclic compound of Formula (1)

The composition for depositing the dielectric film described herein comprises from about 5 to about 0.1 weight percent of a bis-alkoxysilane of Formula (2).

The composition for depositing the dielectric film described herein comprises from about 5 to about 0.1 weight percent of a mono-alkoxysilane compound of Formula (3).

In embodiments, the gaseous composition comprising the alkyl-alkoxysilacyclic compound of Formula (1) is substantially free of or free of halides such as, for example, chlorides.

In embodiments, the gaseous composition comprising the bis-alkoxysilane compound of Formula (2) is substantially free of or free of halides such as, for example, chlorides.

In embodiments, the gaseous composition comprising the mono-alkoxysilane compound of Formula (3) is substantially free of or free of halides such as, for example, chlorides.

In addition to the gaseous composition comprising an alkyl-alkoxysilacyclic compound of Formula (1) and 5% or less of a bis-alkoxysilane compound of Formula (2) or a mono-alkoxysilane compound of Formula (3), additional materials can be introduced into the reaction chamber prior to, during and/or after the deposition reaction. Such materials include, e.g., inert gas (e.g., He, Ar, $N_2$, Kr, Xe, etc., which may be employed as a carrier gas for lesser volatile precursors and/or which can promote the curing of the as-deposited materials and potentially provide a more stable final film if desired). Excited states of the inert gas generated during the plasma based deposition process can also play an important role during the deposition process.

Any reagent employed, including the alkyl-alkoxysilacyclic compound of Formula (1) and 5% or less of a bis-alkoxysilane compound of Formula (2) or a mono-alkoxysilane compound of Formula (3) can be carried into the reactor separately as distinct sources or as a mixture. The reagents can be delivered to the reactor system by any number of means, preferably using a pressurizable stainless steel vessel fitted with the proper valves and fittings to allow the delivery of liquid to the process reactor. Preferably, the precursor is delivered into the process vacuum chamber as a gas, that is, the liquid must be vaporized before it is delivered into the process chamber. Carrier gases such as $N_2$, He, or Ar may be used to help vaporize and transport vapors into the reactor.

The method disclosed herein includes the step of applying energy to the gaseous composition comprising the alkyl-alkoxysilacyclic compound of Formula (1) and 5% or less of a bis-alkoxysilane compound of Formula (2) or a mono-alkoxysilane compound of Formula (3) in the reaction chamber to induce reaction of the gaseous composition comprising the alkyl-alkoxysilacyclic compound of Formula (1) and 5% or less of a bis-alkoxysilane compound of Formula (2) or a mono-alkoxysilane compound of Formula (3) to deposit an organosilica film on the substrate, wherein the organosilica film has a dielectric constant of from ~2.70 to ~3.30 in some embodiments, 2.70 to 3.20 in other embodiments, and 2.80 to 3.10 in still preferred embodiments, an elastic modulus of from ~6 to ~30 GPa, and an at. % carbon of from ~10 to ~45 as measured by XPS. Energy is applied to the gaseous reagents to induce the alkyl-alkoxysilacyclic compound of Formula (1) and 5% or less of a bis-alkoxysilane compound of Formula (2) or a mono-alkoxysilane compound of Formula (3) and other reactants, if present, to react and to form the film on the substrate. Such energy can be provided by, e.g., plasma, pulsed plasma, helicon plasma, high density plasma, inductively coupled plasma, remote plasma, hot filament, and thermal (i.e., non-filament) and methods. A secondary RF frequency source can be used to modify the plasma characteristics at the substrate surface. Preferably, the film is formed by plasma enhanced chemical vapor deposition ("PECVD").

The flow rate for each of the gaseous reagents preferably ranges from 5 to 5000 sccm, more preferably from 10 to 3000 sccm, per single 300 mm wafer. The actual flow rates needed may depend upon wafer size and chamber configuration, and are in no way limited to 300 mm wafers or single wafer chambers.

In certain embodiments, the film is deposited at a deposition rate of from about ~5 to ~600 nanometers (nm) per minute. In other embodiments, the film is deposited at a deposition rate of from about 20 to 200 nanometers (nm) per minute.

The pressure in the reaction chamber during deposition typically ranges from about 0.01 to about 600 torr or from about 1 to 15 torr.

The film is preferably deposited to a thickness of 0.001 to 500 microns, although the thickness can be varied as required. The blanket film deposited on a non-patterned surface has excellent uniformity, with a variation in thickness of less than 3% over 1 standard deviation across the substrate with a reasonable edge exclusion, wherein e.g., a 5 mm outermost edge of the substrate is not included in the statistical calculation of uniformity.

In addition to the inventive OSG products, the present invention includes the process by which the products are made, methods of using the products and compounds and compositions useful for preparing the products. For example, a process for making an integrated circuit on a semiconductor device is disclosed in U.S. Pat. No. 6,583,049, which is herein incorporated by reference.

The dense organosilica films produced by the disclosed methods exhibit excellent resistance to plasma induced damage, particularly during etch and photoresist strip processes.

The dense organosilica films produced by the disclosed methods exhibit excellent mechanical properties for a given dielectric constant relative to dense organosilica films having the same dielectric constant but made from an alkyl-alkoxysilacyclic compound of Formula (1) in the absence of 5% or less of a bis-alkoxysilane compound of Formula (2) or a mono-alkoxysilane compound of Formula (3). The resulting organosilica film (as deposited) typically has a dielectric constant of from ~2.70 to ~3.30 in some embodiments, ~2.80 to ~3.20 in other embodiments, and ~2.70 to ~3.10 in still other embodiments, an elastic modulus of from ~6 to ~30 GPa, and an at. % carbon of from ~10 to ~45 as measured by XPS. In other embodiments, the resulting organosilica film has a dielectric constant of from ~2.70 to ~3.30 in some embodiments, ~2.80 to ~3.20 in other embodiments, and ~2.80 to ~3.10 in still other embodiments, an elastic modulus of from ~6 to ~30 GPa, and an at. % carbon of from ~10 to ~45 as measured by XPS.

The resultant dense organosilica films may also be subjected to a post treating process once deposited. Thus, the term "post-treating" as used herein denotes treating the film with energy (e.g., thermal, plasma, photon, electron, microwave, etc.) or chemicals to further enhance materials properties.

The conditions under which post-treating are conducted can vary greatly. For example, post-treating can be conducted under high pressure or under a vacuum ambient.

UV annealing is a preferred method conducted under the following conditions.

The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.) or reducing (dilute or concentrated hydrogen, hydrocarbons (saturated, unsaturated, linear or branched, aromatics), etc.). The pressure is preferably about 1 Torr to about 1000 Torr. However, a vacuum ambient is preferred for thermal annealing as well as any other post-treating means. The temperature is preferably 200-500° C., and the temperature ramp rate is from 0.1 to 100 deg° C./min. The total UV annealing time is preferably from 0.01 min to 12 hours.

The invention will be illustrated in more detail with reference to the following examples, but it should be understood that it is not deemed to be limited thereto. It is also recognized that the precursors described in this invention can also be used to deposit porous low k films with similar process advantages relative to existing porous low k films (that is a higher elastic modulus for a given value of the dielectric constant with little to no change in the films XPS carbon content, and little to no change expected in the resistance to PID, leakage current, or breakdown field).

EXAMPLES

All experiments were performed on a 300 mm AMAT Producer SE, which deposits films on two wafers at the same time. Thus, the precursor and gas flow rates correspond to the flow rates required to deposit films on two wafers at the same time. The stated RF power per wafer is correct, as each wafer processing station has its own independent RF power supply. The stated deposition pressure is correct, as both wafer processing stations are maintained at the same pressure.

Although illustrated and described above with reference to certain specific embodiments and examples, the present invention is nevertheless not intended to be limited to the details shown. Rather, various modifications may be made in the details within the scope and range of equivalents of the claims and without departing from the spirit of the invention. It is expressly intended, for example, that all ranges broadly recited in this document include within their scope all narrower ranges which fall within the broader ranges. It is also recognized that the gaseous compositions comprising an alkyl-alkoxysilacyclic compound of Formula (1) and 5% or less of a bis-alkoxysilane compound of Formula (2) or a mono-alkoxysilane compound of Formula (3) disclosed in this invention can be used as the structure former for the deposition of porous low k films with a high elastic modulus for a given value of the dielectric constant with little to no change in the films XPS carbon content, and little to no change expected in the resistance to PID, leakage current, or breakdown field.

Thickness and refractive index were measured on a Woollam model M2000 Spectroscopic Ellipsometer. Electrical properties of the films (i.e., dielectric constant, leakage current, initial breakdown field) were determined using Hg probe technique on mid-resistivity p-type wafers (range 8-12 ohm-cm). FTIR spectra were measured using a Thermo Fisher Scientific Model iS50 spectrometer fitted with a nitrogen purged Pike Technologies Map300 for handling 12-inch wafers. FTIR spectra were used to calculate the relative density of various functional groups in the film, such as the relative density of bridging disilylmethylene groups (via the $SiCH_2Si$ IR band centered near 1360 $cm^{-1}$), terminal silicon methyl groups (via the $Si(CH_3)_x$ IR bands centered near 1270 $cm^{-1}$), and $CH_x$ (via the $CH_x$ IR bands between ~2800 $cm^{-1}$ and 3000 $cm^{1}$). To illustrate, the relative density of bridging disilylmethylene groups in the film (i.e., the $SiCH_2Si$ density), as determined by infrared spectroscopy, was calculated as 1E4 times the area of the $SiCH_2Si$ infrared band centered near 1360 $cm^{-1}$ divided by the area of the $SiO_x$ bands between approximately 1250 $cm^{-1}$ to 920 $cm^{-1}$. Mechanical properties were determined using a KLA iNano Nanoindenter.

Compositional data were obtained by x-ray photoelectron spectroscopy (XPS) on either a PHI 5600 (73560, 73808) or a Thermo K-Alpha (73846) and are provided in atomic weight percent. The atomic weight percent (%) values reported in the table do not include hydrogen.

Comparative Example 1: Deposition of a Dense Low k Film Using the 1-Methyl-1-Isopropoxy-1-Silacyclopentane (MPSCP) Precursor A dense MPSCP based film was deposited using the following process conditions for 300 mm processing. The MPSCP precursor was delivered to the reaction chamber via direct liquid injection (DLI) at a flow rate of 2000 mg/min using 1500 standard cubic centimeters per minute (sccm) of He carrier gas flow, oxygen was delivered to the reaction chamber via a mass flow controller (MFC) at a flow rate of 25 sccm, 380 milli-inch showerhead/heated pedestal spacing, 400° C. pedestal temperature, 7.5 Torr chamber pressure to which a 391 Watt 13.56 MHz plasma was applied. Various attributes of the film (e.g., dielectric constant (k), elastic modulus and hardness, infrared spectra, and atomic weight percent carbon (% C)) were obtained as described above and are provided in Table 1.

TABLE 1

Comparative properties for films deposited using 1-Methyl-1-Isopropoxy-1-silacyclopentane (MPSCP) and a mixture of 1-Methyl-1-Isopropoxy-1-silacyclopentane (MPSCP) and 0.9% bis(isopropoxy)-methyl-butylsilane.

| Property | MPSCP and 0.9% Bis(isopropoxy)-methyl-butylsilane Based Film | MPSCP Based Film |
|---|---|---|
| Dielectric Constant, k | 3.1 | 3.1 |
| Elastic Modulus (GPa) | 19 | 18 |
| RI (632 nm) | 1.487 | 1.490 |
| XPS Carbon Content (at. %) | 30 | 30 |
| $CH_x/SiO_x$*1E2 | 3.9 | 3.9 |
| $Si(CH_3)_x/SiO_x$*1E2 | 2.4 | 2.4 |
| $SiCH_2Si/SiO_x$*1E4 | 18 | 18 |

Comparative Example 2: Deposition of a Dense Low k Film Using a Mixture of 1-Methyl-1-Isopropoxy-1-Silacyclopentane (MPSCP) and 0.9% bis(isopropoxy)-methyl-butylsilane A dense low k film was deposited using a mixture of MPSCP and 0.9% bis(isopropoxy)-methyl-butylsilane using the following process conditions for 300 mm processing. The mixture of MPSCP and 0.9% bis(isopropoxy)-methyl-butylsilane was delivered to the reaction chamber via direct liquid injection (DLI) at a flow rate of 2000 mg/min using 1500 sccm of He carrier gas flow, oxygen was delivered to the reaction chamber via a MFC at a flow rate of 25 sccm, 380 milli-inch showerhead/heated pedestal spacing, 400° C. pedestal temperature, 7.5 Torr chamber pressure to which a 391 Watt 13.56 MHz plasma was applied. Various attributes of the film (e.g., dielectric constant (k), elastic modulus and hardness, infrared spectra, and atomic weight percent carbon (% C)) were obtained as described above and are provided in Table 1.

Example 3: Deposition of a Dense Low k Film Using the DEMS® Precursor

A dense DEMS® based film was deposited using the following process conditions for 300 mm processing. The DEMS® precursor was delivered to the reaction chamber via direct liquid injection (DLI) at a flow rate of 750 mg/min using 2250 sccm of He carrier gas flow, 380 milli-inch showerhead/heated pedestal spacing, 345° C. pedestal temperature, 10 Torr chamber pressure to which a 200 Watt 13.56 MHz plasma was applied. Various attributes of the film (e.g., dielectric constant (k) and infrared spectra) were obtained as described above and are provided in Table 2.

TABLE 2

Comparative properties for films deposited using DEMS ® and a 50:50 mixture of DEMS ® and TEOS.

| Property | DEMS ® and TEOS Based Film | DEMS ® Based Film |
|---|---|---|
| Dielectric Constant, k | 3.2 | 3.2 |
| RI (632 nm) | 1.402 | 1.461 |
| $CH_x/SiO_x$*1E2 | 1.3 | 1.6 |
| $Si(CH_3)_x/SiO_x$*1E2 | 2.1 | 2.1 |

TABLE 2-continued

Comparative properties for films deposited using DEMS ® and a 50:50 mixture of DEMS ® and TEOS.

| Property | DEMS ® and TEOS Based Film | DEMS ® Based Film |
|---|---|---|
| $SiCH_2Si/SiO_x$*1E4 | 1.0 | 13 |

Example 4: Deposition of a Dense Low k Film Using a Mixture of DEMS® and TEOS A dense low k film was deposited using a mixture of DEMS® and TEOS using the following process conditions for 300 mm processing. The DEMS® precursor was delivered to the reaction chamber via direct liquid injection (DLI) at a flow rate of 1625 mg/min using 1000 sccm of He carrier gas flow, TEOS was delivered to the reaction chamber via direct liquid injection (DLI) at a flow rate of 1750 mg/min using 1000 sccm of He carrier gas flow, oxygen was delivered to the reaction chamber via a MFC at a flow rate of 50 sccm, 380 milli-inch showerhead/heated pedestal spacing, 300° C. pedestal temperature, 7.0 Torr chamber pressure to which a 400 Watt 13.56 MHz plasma was applied. Various attributes of the film (e.g., dielectric constant (k) and infrared spectra) were obtained as described above and are provided in Table 2.

Table 1 shows that the film deposited using a mixture of MPSCP and 0.9% bis(isopropoxy)-methyl-butylsilane has an unexpectedly high elastic modulus relative to the film deposited using MPSCP. Within the uncertainty of the measurement, both films have the same dielectric constant, the same XPS carbon content, the same relative $CH_x$ density, $Si(CH_3)_x$ density, and $Si(CH_2)Si$ density as calculated via their individual IR spectra. Thus, relative to the MPSCP based film, the film deposited using a mixture MPSCP and 0.9% bis(isopropoxy)-methyl-butylsilane has a higher elastic modulus (+5%) and exhibits little to no change in its other film properties. Consequently, the film deposited using a mixture MPSCP and 0.9% bis(isopropoxy)-methyl-butylsilane would be expected to have the same strong resistance to PID as the film deposited from MPSCP only. The film deposited using a mixture MPSCP and 0.9% bis(isopropoxy)-methyl-butylsilane would also be expected to have the same low leakage current and high initial breakdown field as the film deposited from MPSCP only.

FIG. 1 shows the infrared spectrum of a comparative film deposited from MPSCP and a spectrum of a film deposited from a mixture of MPSCP and 0.9% bis(isopropoxy)-methyl-butylsilane. The IR spectra are nearly identical and show that the film deposited using a mixture of MPSCP and 0.9% bis(isopropoxy)-methyl-butylsilane exhibits little to no change in the identity and the relative density of the IR active functional groups relative to the film deposited only from MPSCP.

Figure 2:
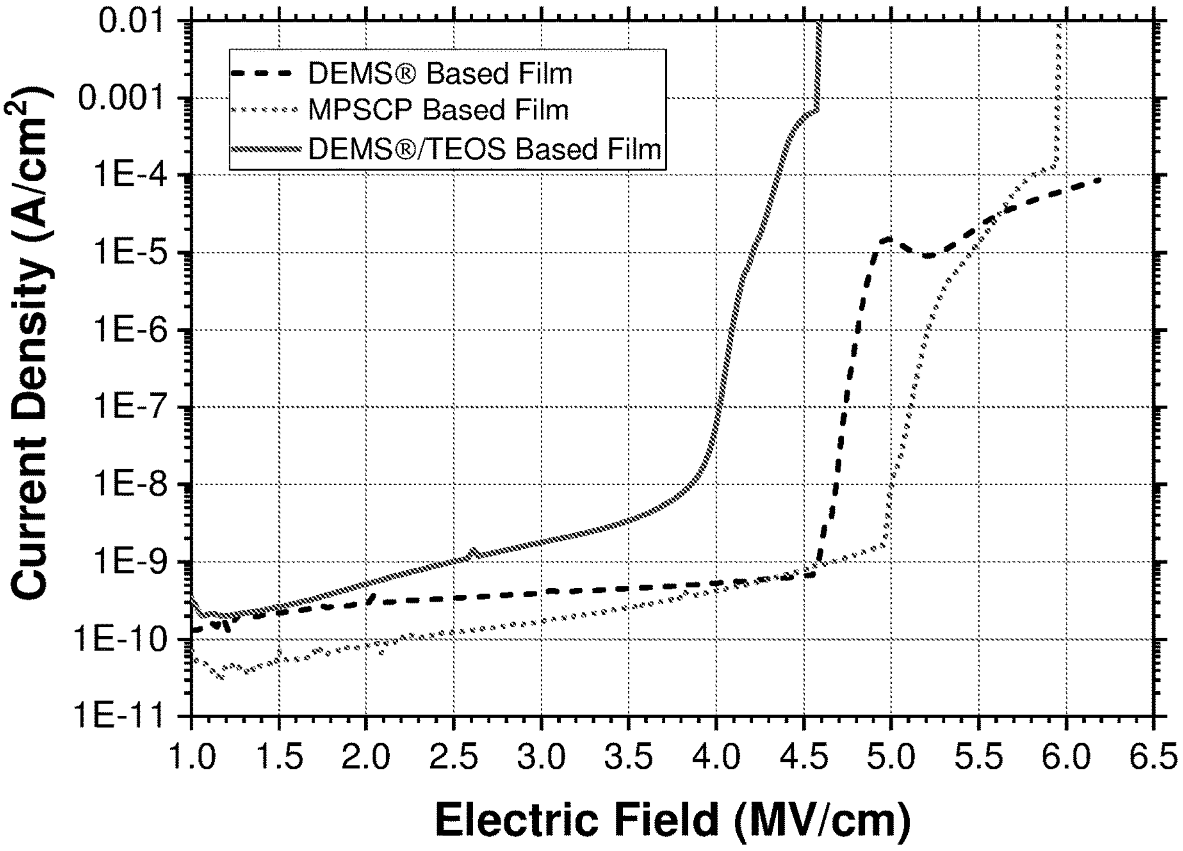
FIG. 2 shows the leakage current density as a function of applied electric field for three different low k films: a comparative film deposited from DEMS®, a comparative film deposited from a mixture of DEMS® and TEOS, and a film deposited from a mixture of MPSCP and 0.9% bis(isopropoxy)-methyl-butylsilane.

FIG. 2 shows the current density as a function of the applied electric field for three different low k films: a comparative film deposited from DEMS®, a comparative film deposited from a mixture of DEMS® and TEOS, and a comparative film deposited from MPSCP. The film deposited from the mixture of DEMS® and TEOS has a higher leakage current (typically the current density at an electric field strength of 1 MV/cm or 2 MV/cm) and a lower initial breakdown field (typically the strength of the electric field where the current density rapidly increases by at least two orders of magnitude) relative to the film deposited from DEMS®. In contrast, the films described in this invention deposited from a mixture of MPSCP and 0.9% bis(isopropoxy)-methyl-butylsilane have a higher elastic modulus (+5%) and are expected to have a leakage current and initial breakdown field strength that is nearly identical to that of the film deposited from MPSCP only.

The properties of the film deposited from DEMS® and the film deposited from a mixture of DEMS® and TEOS shown in FIG. 2 are given in Table 2. Both films have the same dielectric constant, but the film deposited from a mixture of DEMS® and TEOS has less total carbon content as indicated by the smaller relative IR densities of $CH_x$ and $SiCH_2Si$. Note that for the film deposited from a mixture of DEMS® and TEOS the relative density of the bridging disilylmethylene ($SiCH_2Si$) groups is lower by an order of magnitude relative to the film deposited from DEMS®. Thus, the film deposited from a mixture of DEMS® and TEOS is expected to have less resistance to PID than the film deposited from DEMS® only.

The invention claimed is:

1. A method for making a dense organosilica film, the method comprising:

providing a substrate within a reaction chamber;

introducing into the reaction chamber a gaseous mixture comprising reagent a) an alkyl-alkoxysilacyclic compound of Formula (1)

(1)

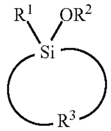

wherein $R^1$ is independently selected from hydrogen, a linear or branched $C_1$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ hetero-cyclic alkyl group, a $C_5$ to $C_{10}$ aryl group, and a $C_3$ to $C_{10}$ hetero-aryl group; $R^2$ is selected from hydrogen, a linear or branched $C_1$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ hetero-cyclic alkyl group, a $C_5$ to $C_{10}$ aryl group, and a $C_3$ to $C_{10}$ hetero-aryl group; and $R^3$ is selected from a $C_3$ to $C_{10}$ alkyl di-radical which forms a four-membered, five-membered, or six-membered cyclic ring with the Si atom, and reagent b) a bis-alkoxysilane having the structure given in Formula (2) or a mono-alkoxysilane having the structure given in Formula (3):

$$R^6R^5Si(OR^4)_2 \quad (2)$$

$$HR^6R^5Si(OR^4) \quad (3)$$

wherein $R^4$ is selected from hydrogen, a linear or branched $C_1$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ hetero-cyclic alkyl group, a $C_5$ to $C_{10}$ aryl group, and a $C_3$ to $C_{10}$ hetero-aryl group and $R^5$ and $R^6$ are independently selected from hydrogen, a linear or branched $C_1$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ hetero-cyclic alkyl group, a $C_5$ to $C_{10}$ aryl group, and a $C_3$ to $C_{10}$ hetero-aryl group;

applying energy to the gaseous mixture in the reaction chamber to induce reaction of the gaseous mixture and to thereby deposit the dense organosilica film on the substrate, wherein the mixture is introduced into the reaction chamber with flow rates for reagents a and b ranging between 5 and 5000 sccm, and with reagent b being no more than 5% of the mixture.

2. The method of claim 1, wherein the alkyl-alkoxysilacyclic compound of Formula (1) is substantially free of one or more impurities selected from the group consisting of a halide, water, metals, and combinations thereof.

3. The method of claim 1, wherein the bis-alkoxysilane having the structure given in Formula (2) is substantially free of one or more impurities selected from the group consisting of a halide, water, metals, and combinations thereof.

4. The method of claim 1, wherein the mono-alkoxysilane having the structure given in Formula (3) is substantially free of one or more impurities selected from the group consisting of a halide, water, metals, and combinations thereof.

5. The method of claim 1, wherein the organosilica film has a dielectric constant of from ~2.70 to ~3.30, an elastic modulus of from ~6 to ~30 GPa, and an XPS carbon content of ~10 to 45%.

6. The method of claim 1 which is a chemical vapor deposition method.

7. The method of claim 1 which is a plasma enhanced chemical vapor deposition method.

8. The method of claim 1 wherein the gaseous composition further comprises at least one oxidant selected from the group consisting of $O_2$, $N_2O$, NO, $NO_2$, $CO_2$, CO, water, $H_2O_2$, ozone, alcohols, and combinations thereof.

9. The method of claim 1 wherein the gaseous composition does not comprise an oxidant.

10. The method of claim 1 wherein the reaction chamber in the applying step comprises at least one gas selected from the group consisting of He, Ar, $N_2$, Kr, Xe, $CO_2$, and CO.

11. The method of claim 1 wherein the organosilica film has a refractive index (RI) of from ~1.3 to ~1.7 at 632 nm.

12. The method of claim 1 wherein the organosilica film is deposited at a rate of from ~5 nm/min to ~600 nm/min.

13. A gaseous composition comprising reagent a) an alkyl-alkoxysilacyclic compound of Formula (1)

(1)

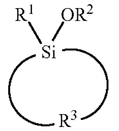

wherein $R^1$ is independently selected from hydrogen, a linear or branched $C_1$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ hetero-cyclic alkyl group, a $C_5$ to $C_{10}$ aryl group, and a $C_3$ to $C_{10}$ hetero-aryl group; $R^2$ is selected from hydrogen, a linear or branched $C_1$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ hetero-cyclic alkyl group, a $C_5$ to $C_{10}$ aryl group, and a $C_3$ to $C_{10}$ hetero-aryl group; and $R^3$ is selected from a $C_3$ to $C_{10}$ alkyl di-radical which forms a four-membered, five-membered, or six-membered cyclic ring with the Si atom; and reagent b) a bis-alkoxysilane having the structure given in Formula (2) or a mono-alkoxysilane having the structure given in Formula (3):

$$R^6R^5Si(OR^4)_2 \quad (2)$$

$$HR^6R^5Si(OR^4) \quad (3)$$

wherein $R^4$ is selected from hydrogen, a linear or branched $C_1$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ hetero-cyclic alkyl group, a $C_5$ to $C_{10}$ aryl group, and a $C_3$ to $C_{10}$ hetero-aryl group and $R^5$ and $R^6$ are independently selected from hydrogen, a linear or branched $C_1$ to $C_{10}$ alkyl group, a linear or branched $C_2$ to $C_{10}$ alkenyl group, a linear or branched $C_2$ to $C_{10}$ alkynyl group, a $C_3$ to $C_{10}$ cyclic alkyl group, a $C_3$ to $C_{10}$ hetero-cyclic alkyl group, a $C_5$ to $C_{10}$ aryl group, and a $C_3$ to $C_{10}$ hetero-aryl group, wherein the mixture has no greater than 5% of reagent b.

14. The composition of claim 1, wherein the alkyl-alkoxysilacyclic compound of Formula (1) is substantially free of chloride ions.

15. The composition of claim 14, wherein chloride ions, if present, are present at a concentration of 50 ppm or less as measured by IC.

16. The composition of claim 15, wherein the chloride ions, if present, are present at a concentration of 10 ppm or less as measured by IC.

17. The composition of claim 16, wherein the chloride ions, if present, are present at a concentration of 5 ppm or less as measured by IC.

18. The composition of claim 13, the wherein the bis-alkoxysilane having the structure given in Formula (2) is substantially free of chloride ions.

19. The composition of claim 18, wherein the chloride ions, if present, are present at a concentration of 10 ppm or less as measured by IC.

20. The composition of claim 19, wherein the chloride ions, if present, are present at a concentration of 5 ppm or less as measured by IC.

21. The composition of claim 13, the wherein the mono-alkoxysilane having the structure given in Formula (3) is substantially free of chloride ions.

22. The composition of claim 21, wherein chloride ions, if present, are present at a concentration of 50 ppm or less as measured by IC.

23. The composition of claim 22, wherein the chloride ions, if present, are present at a concentration of 10 ppm or less as measured by IC.

24. The composition of claim 23, wherein the chloride ions, if present, are present at a concentration of 5 ppm or less as measured by IC.

* * * * *